United States Patent [19]

Punola et al.

[11] Patent Number: 5,264,245
[45] Date of Patent: Nov. 23, 1993

[54] CVD METHOD FOR FORMING UNIFORM COATINGS

[75] Inventors: David C. Punola, Muskegon; William C. Basta, Montague; Jeffrey S. Smith, Muskegon, all of Mich.

[73] Assignee: Howmet Corporation, Greenwich, Conn.

[21] Appl. No.: 802,257

[22] Filed: Dec. 4, 1991

[51] Int. Cl.$^5$ .................... C23C 16/08; B05D 07/22
[52] U.S. Cl. ................... 427/237; 427/250; 427/253; 427/255.1; 118/719; 118/724; 118/725
[58] Field of Search ............ 427/250, 253, 255.1, 427/237; 118/719, 724, 725

[56] References Cited

U.S. PATENT DOCUMENTS

| | | | |
|---|---|---|---|
| 3,486,927 | 12/1969 | Gaujé | 117/107.2/ |
| 3,961,098 | 6/1976 | Bessen | 427/34 |
| 3,976,436 | 8/1976 | Chang | 29/196.6 |
| 4,098,450 | 7/1978 | Keller et al. | 228/119 |
| 4,132,816 | 1/1979 | Benden et al. | 427/237 |
| 4,156,042 | 5/1979 | Hayman et al. | 427/253 |
| 4,239,819 | 12/1980 | Holzl | 427/255.2 |
| 4,290,391 | 9/1981 | Baldi | 427/237 |
| 4,427,720 | 1/1984 | Gaujé | 427/237/ |
| 4,525,389 | 6/1985 | Stemmler et al. | 427/255 |
| 4,747,368 | 5/1988 | Brien et al. | 118/715 |
| 4,751,109 | 6/1988 | Sarin et al. | 427/255 |
| 4,890,574 | 1/1990 | Sarin et al. | 118/719 |
| 4,933,239 | 6/1990 | Olson et al. | 428/557 |

FOREIGN PATENT DOCUMENTS 0117542 9/1984 European Pat. Off. .
0222241 5/1987 European Pat. Off. .

OTHER PUBLICATIONS

J. S. Smith, D. H. Boone, "Platinum Modified Aluminides–Present Status", Gas Turbine and Aeroengine Congress and Exposition, Jun. 11–14, 1990 Brussels, Belgium.

W. Sun, H. Lin, M. Hon, "Kinetics of the Formation of Nickel Aluminide Coatings on Pure Nickel by Chemical Vapour Deposition", thin Solid Films, 146, pp. 55–64, 1987 The Netherlands.

G. Gaujé, R. Morbioli, "Vapor Phase Aluminizing to Protect Turbine Airfoils", pp. 13–26.

G. Marijnissen, "Codeposition of Chromium and Aluminum During a Pack Process", pp. 27–34.

J. Restall, B. Gill, C. Hayman, N. Archer "A Process for Protecting Gas Turbine Blade Cooling Passages Against Degradation", pp. 405–411 Superalloys, 1980 Metals Park, Ohio.

K. Brennfleck, E. Fitzer, D. Kehr "Preparation of Hot Corrision Resistant Aluminide Layers by CVD of Aluminum From its Subchloride", pp. 578–592.

(List continued on next page.)

Primary Examiner—Shrive Beck
Assistant Examiner—Bret Chen
Attorney, Agent, or Firm—Flynn, Thiel, Boutell & Tanis

[57] ABSTRACT

A chemical vapor deposition (CVD) method utilizing an apparatus comprising a reactor having a coating chamber at elevated temperature, means for supporting substrates to be coated at different zones in the coating chamber, and means for supplying a gaseous reactant stream to the chamber for distribution to the coating zones in a manner that the stream is heated to substantially different temperatures at different coating zones. Reactivity-altering material is disposed at the coating zones for contact by the reactant stream supplied thereto before the reactant stream contacts a substrate at the zones. The reactivity-altering material includes a composition that differs between coating zones in dependence on the reactant stream temperatures at the coating zones as necessary to alter the reactivity of the reactant (i.e., activity of a particular chemical specie of the reactant stream) stream at the coating zones in a manner to provide substantially the same reactant reactivity at all coating zones. CVD coatings are thereby produced on the substrates that exhibit improved uniformity in composition and thickness from one substrate to the next at the different zones.

13 Claims, 2 Drawing Sheets

OTHER PUBLICATIONS

C. Powell, I. Campbell *Vapor-Plating The Formation of Coatings by Vapor-Deposition Techniques*, pp. 24–26, 1955 London.

L. Pochet "The HF 'Fluoride-Ion' Cleaning Technique for Superalloys", Ti-Coating, Inc. 1987.

G. Goward, L. Cannon "Pack Cementation Coatings for Superalloys A Review of History, Theory, and Practice", Gas Turbine Conference and Exhibition, May 31–Jun. 4, 1987, Anaheim, CA.

A. Clavel "Coated Tools: Two Decades of Improving Productivity", *Cutting tool Engineering*, vol. 41, No. 2, Feb. 1989.

A. Clavel "Productivity CVD and PVD Coatings for the Metalworking Industry", 76th AESF Annual Technical Conference Jun. 1989, Cleveland.

CVD METHOD FOR FORMING UNIFORM COATINGS

FIELD OF THE INVENTION

The present invention relates to a chemical vapor deposition (CVD) coating apparatus and method for protectively coating substrates and, more particularly, to a CVD coating apparatus and method wherein the reactivity of a gaseous reactant stream is controlled at different coating zones in the reactor to accommodate substantial differences in the temperature of the stream at the different coating zones so as to produce CVD coatings having improved uniformity in composition and thickness.

BACKGROUND OF THE INVENTION

Chemical vapor deposition (CVD) is a well known method for depositing and forming a protective coating on substrates. Typically, the substrates are loaded into a reaction furnace (reactor), heated to a suitable reaction temperature, and exposed in the reactor to one or more elevated temperature gaseous reactant streams that react with the substrate surfaces to deposit a coating or layer thereon. The CVD deposited coating or layer can be reacted with the substrate by suitable heating in the reactor to form a protective diffusion coating thereon; e.g., a high temperature oxidation and corrosion resistant nickel or cobalt aluminide coating on nickel or cobalt base superalloy substrates as described in the Gauje U.S. Pat. No. 3,486,927.

As illustrated in that patent, a gaseous reactant stream may be formed in-situ inside the reactor for reaction with the substrates. Alternately, the gaseous reactant stream may be formed outside the reactor in a heated reactant generator and continuously introduced into the reactor in a carrier gas, such as a reducing or inert gas, so as to pass over the substrates. After passing over the substrates, the carrier gas and any excess, unreacted gaseous reactant are exhausted from the reactor to maintain a continuous gas flow therethrough over the substrates.

In one particular CVD coating apparatus, a plurality of substrates to be coated are fixtured about a gas distribution conduit network within the reactor, and the gaseous reactant stream, such as a metal chloride or fluoride gas, in a reducing or inert carrier gas, is formed external of the reactor in a reactant generator and is metered into the reactor via the conduit network for contact with exterior surfaces of the substrates. A separate gaseous reactant generator external of the reactor and separate distribution conduit network can be optionally provided to supply and meter another gaseous reactant stream into the reactor for contacting interior surfaces of the substrates if they are hollow. Both external and internal coatings can thereby be concurrently formed on hollow substrates, such as hollow gas turbine engine blades, using the CVD apparatus.

In this particular apparatus, the gaseous reactant streams (external and optional internal coating streams) are distributed by respective elongated distribution conduits extending through the heated reactor chamber to different coating zones disposed at axial intervals along each distribution conduit. The gaseous reactant streams are thus heated as they are distributed in the heated reactor chamber to the different coating zones such that the streams may exhibit substantially different temperatures and thus different chemical reactivities toward the substrates to be coated at different zones. Such different coating gas reactivities can result in formation of CVD coatings which are non-uniform in composition and thickness from one coating zone to the next.

It is an object of the present invention to provide an improved CVD apparatus and method wherein the reactivity of the gaseous reactant stream (i.e., activity of a particular chemical species in the reactant stream) is controlled at different coating zones in a heated reactor chamber in a manner to accommodate substantially different temperatures present at the coating zones to produce CVD coatings exhibiting improved uniformity in thickness and composition from one coating zone to the next.

It is another object of the present invention to provide an improved CVD apparatus and method wherein the reactivity of the gaseous reactant stream is controlled at different coating zones in a heated reactor chamber by providing at different coating zones having substantially different reactant stream temperatures, a reactivity-altering material whose composition is selected in dependence on the temperature of the reactant stream at the zones to alter the reactivity of the reactant stream upon contact therewith in a manner to provide substantially the same reactant reactivity at all coating zones.

SUMMARY OF THE INVENTION

The present invention contemplates a chemical vapor deposition (CVD) apparatus comprising a reactor having a coating chamber at an elevated temperature, means for supporting substrates to be coated at different zones in the coating chamber, and means for supplying a gaseous reactant stream to the chamber for distribution to the coating zones wherein the stream is heated to substantially different temperatures at different (e.g., two or more) coating zones.

Reactivity-altering material is disposed at the coating zones for contact by the reactant stream supplied thereto before the reactant stream contacts a substrate at the zones. The reactivity-altering material includes a composition that differs between coating zones of substantially different temperatures in dependence on reactant stream temperature thereat as necessary to alter the reactivity of the reactant stream (i.e., activity of a particular chemical specie of the reactant stream) in a manner to provide substantially the same reactant stream reactivity at all coating zones. CVD coatings are thereby produced exhibiting improved uniformity in composition and thickness from one zone to the next.

In one embodiment of the invention, the means for supplying the gaseous reactant stream comprises a generator for producing a volatile metal compound. The reactivity-altering material preferably comprises an alloy of the metal wherein the concentration of the metal in the alloy is varied as necessary between coating zones inversely with the temperature of the volatile metal compound at the coating zones. Preferably, the alloy is in alloy particulate form at the zones, although elemental particulate mixture or a liquid form thereof can be used.

In a working embodiment of the invention, the means for supplying the gaseous reactant stream comprises a low temperature metal halide gas generator located externally of the chamber and a gas distribution conduit communicated to the generator and extending through the chamber to the coating zones for supplying the gas thereto. The means for supporting the substrates comprises a plurality of substrate supports spaced apart about the gas distribution conduit in the chamber and along a longitudinal axis of the conduit such that a plurality of axial coating zones are provided in the coating chamber.

In a particular working embodiment of the invention for forming a CVD aluminide coating on the substrates, the apparatus comprises a reactor having a coating chamber at elevated temperature, means for supporting substrates to be coated at different zones in the coating chamber, means for supplying an aluminum halide gas stream to the chamber for distribution to the coating zones in a manner that the stream is heated to substantially different temperatures at different coating zones, and a source of aluminum alloy disposed at the coating zones for contact by the reactant stream supplied thereto before the stream contacts a substrate thereat. The aluminum alloy has a concentration of aluminum that varies between coating zones of substantially different temperature in inverse relation to the reactant stream temperature thereat as necessary to alter the reactivity of the stream in a manner to provide substantially the same stream reactivity at all coating zones, thereby forming on the substrates an aluminide coating exhibiting improved uniformity in composition and thickness from one coating zone to the next.

The present invention also contemplates a method of chemical vapor deposition of a coating on a plurality of substrates disposed at different zones in a heated coating chamber of a reactor wherein the method includes the steps of supplying a gaseous reactant stream to the chamber for distribution to each zone in a manner that the stream is heated to substantially different temperatures at different zones, heating the substrates to an elevated reaction temperature, contacting the gaseous reactant stream at the zones with a reactivity-altering material whose composition differs between coating zones of substantially different temperature in dependence on the stream temperature thereat as necessary to alter the reactivity of the reactant stream at the zones in a manner to provide substantially the same stream reactivity at all coating zones, and contacting a substrate at a respective zone with the gaseous reactant stream after the stream contacts the reactivity-altering material at that zone.

In one embodiment of the invention, an external surface of the substrate is contacted by the gaseous reactant stream at each zone after the stream contacts the reactivity-altering material.

In another embodiment of the invention, an internal surface of the substrate is contacted by the gaseous reactant stream after the stream contacts the reactivity-altering material.

In still another embodiment of the invention, both internal and external surfaces of the substrate are contacted by the gaseous reactant stream after the stream contacts the reactivity-altering material.

A method of forming a CVD aluminide coating on a plurality of substrates disposed at different zones in a heated coating chamber of a reactor involves the steps of supplying a aluminum halide gas stream to the chamber for distribution to each zone in a manner that the stream is heated to substantially different temperatures at different zones, heating the substrates to an elevated reaction temperature, contacting the aluminum halide gas stream at the zones with a source of an aluminum alloy whose concentration of aluminum varies between coating zones of substantially different temperature in inverse relation to the stream temperature thereat as necessary to alter the reactivity of the metal halide gas stream at the zones in a manner to provide substantially the same reactant stream reactivity at the zones, and contacting a substrate at the zones with the metal halide gas stream after the stream contacts the aluminum alloy particulates at the zones.

DESCRIPTION OF THE DRAWINGS

A better understanding of the present invention will be obtained with reference to the detailed description below taken in conjunction with the following drawings in which.

DETAILED DESCRIPTION OF THE INVENTION

Figure 1:
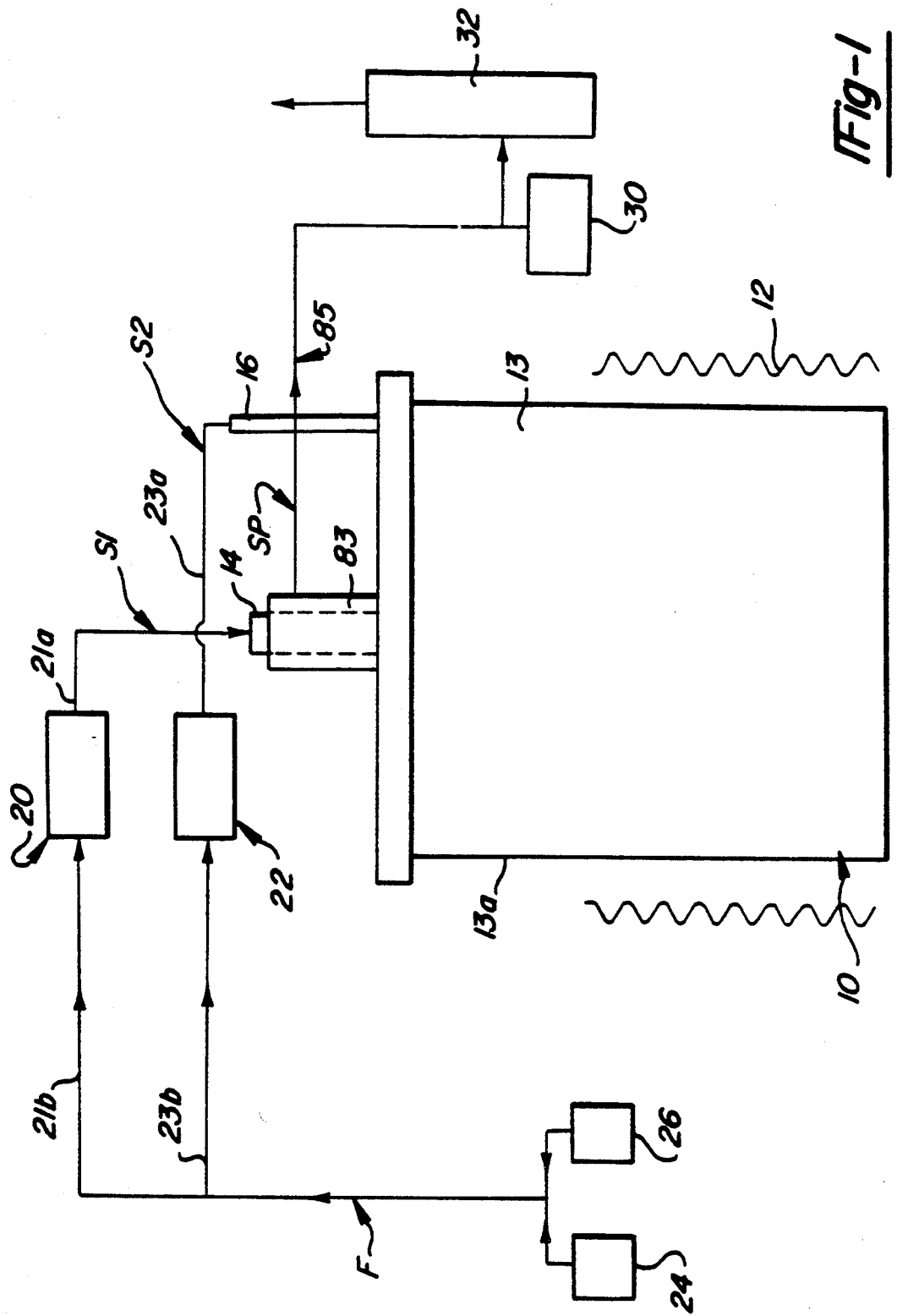
FIG. 1 is a schematic view of a CVD system having a coating apparatus in accordance with one embodiment of the present invention for practicing a method embodiment of the invention.

Referring to FIG. 1, a CVD coating system is schematically illustrated as including a reactor or retort 10 confronted at a lower region by a heating furnace 12, which may be of the electrical resistance or other known types. The reactor 10 includes a central inlet conduit 14 through which a gaseous reactant stream S1 is supplied to a coating chamber 13 therein for external coating of hollow substrates positioned in the reactor 10 in a manner to be described below. The reactor 10 also includes an optional auxiliary inlet conduit 16 through which a gaseous reactant stream S2 is supplied for internal coating of hollow substrates, if desired. The substrates are heated in the reactor chamber 13 to a suitable coating temperature as a result of radiation from the heated chamber wall 13a.

In one embodiment of the invention, the central inlet conduit 14 is communicated to a conventional low temperature metal halide gas generator 20 located externally of the reactor 10 via a heated conduit 21a. The optional auxiliary inlet 16 is communicated to another conventional low temperature metal halide gas generator 22 located externally of the reactor 10 via a heated conduit 23a. The conduits 21a,23a are heated by suitable heating devices (not shown) to prevent condensation of the metal halide gas therein.

The metal halide gas generators 20,22 are typically supplied via conduits 21b,23b with a gas flow F comprising a mixture of an acid halide gas, such as typically HCl or HF gas, and a reducing or inert carrier gas, such as hydrogen, argon or mixtures thereof, from suitable sources 24,26. For example, the acid halide gas and the carrier gas are usually supplied from respective high pressure cylinders and blended in suitable proportions to provide the gas flow F to generators 20,22.

Exemplary low temperature metal halide gas generators 20,22 for use in practicing the invention to form an oxidation and corrosion resistant aluminide coating on nickel base superalloy substrates comprises a bed (not shown) of aluminum pellets and a heating device (not shown) to heat the pellets to a desired reaction temperature depending upon the acid halide gas to be supplied thereto. A pellet temperature of about 300° C. is used for HCl gas while a pellet temperature of about 900° C. is used for HF gas.

The acid halide/carrier gas flow F is supplied to the generators 20,22 to flow over the pellets under conditions of temperature, pressure and flow rate to form aluminum trichloride or trifluoride gas (i.e., volatile metal compounds) in desired proportion to the carrier gas. The resulting aluminum halide/carrier gas mixture is supplied from each generator 20,22 as gaseous reactant streams S1,S2 to the reactor chamber 13 via the heated conduits shown.

Typically, the generators 20, 22 are selected to supply the same metal halide/carrier gas stream to the chamber 13 for aluminide coating the outer and inner surfaces of the heated substrates. However, the invention is not so limited and may be practiced using different coating gas compositions supplied from the generators 20,22 to the inlet conduits 14,16.

A suitable pump 30, such as a vacuum pump, is connected to the exhaust of the reactor chamber 13 in a manner to be described below to maintain a desired flow rate of the streams S1,S2 through the generators 20,22 and the reactor chamber 13 and to exhaust the spent coating gas stream from the reactor chamber 13. The spent coating gas stream SP is passed through a scrubber 32 before return to the ambient atmosphere.

Figure 2:
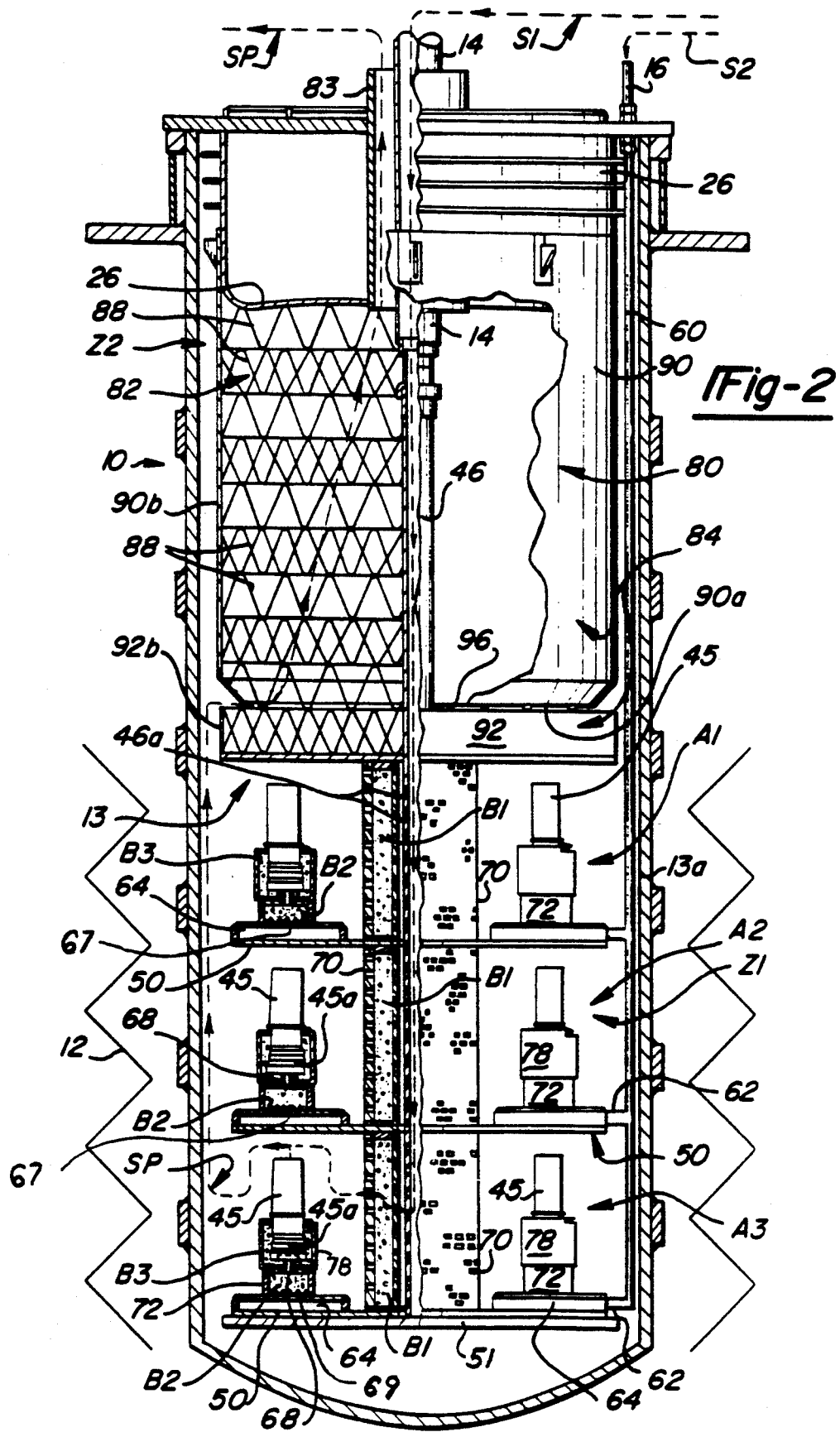
FIG. 2 is a cross-sectional view of a CVD coating apparatus in accordance with one embodiment of the invention with some components shown in elevation.

The interior of the reactor 10 is shown in FIG. 2. The reactor chamber 13 includes a lower coating region Z1 in which a plurality of substrates 45, illustrated as hollow gas turbine engine blades, are disposed on substrate supports 50 for coating on the exterior and optionally on the interior by the gaseous reactant streams S1,S2. The lowermost substrate support 50 is supported on a bottom plate 51 fastened (e.g., welded) to the elongated, central gas distribution conduit 46. The supports 50 thereabove are supported on the canisters 70 to be described below or on collars (not shown) fastened on the distribution conduit 46. Axial coating zones A1,A2,A3 are formed as a result of the axial spacing of the substrate supports 50 along the longitudinal axis of the conduit 46. The substrates 45 may be precoated with a suitable metallic layer, such as, for example, platinum or other noble metal, transition metal, and the like for incorporation into the CVD coating.

The coating region Z1 receives the gaseous reactant stream S1 from the external generator 20 via the elongated, central gas distribution conduit 46 that extends from the heated inlet conduit 14 through a water-cooled reactor cover 26 and through the exhaust region Z2 and coating region Z1 along the longitudinal axis of the chamber 13. At the coating region, the conduit 46 is perforated to include a plurality of radially extending apertures 46a for radially discharging the stream S1. The apertures 46a thus form an inlet of the coating region Z1 for introduction of the gaseous reactant stream S1 to the coating zones A1,A2,A3.

The coating region Z1 also optionally receives the gaseous reactant stream S2 from the external generator 22 via an elongated, offset distribution conduit 60 that extends from the inlet conduit 16 through the water-cooled reactor cover 26 and through the exhaust region Z2 and coating region Z1 along an offset axis of the chamber 13. At the coating region, the conduit 60 is connected in gas flow communication via stub pipes 62 to annular gas manifolds 64 on which the substrates 45 are positioned. As shown in FIG. 2, the manifolds 64 communicate via gas openings 67 and gas tubes 68 to the interior of the substrates 45 for supplying the stream S2 through the heated substrates 45 at coating zones A1,A2,A3. Each gas tube 68 typically comprises a hollow, open-ended T-shaped member inserted in the open end of the lowermost substrate portion 45a, see lower, left-hand substrate 45 in FIG. 2, such that the stream enters the lower open end and exits apertures in the upper end of the T-shaped member. The spent gas stream SP exits from the interior of the hollow substrates 45 through suitable openings in the upper end thereof as illustrated for the lower, left-hand substrate in FIG. 2.

When the gaseous reactant streams S1,S2 each comprise an aluminum trichloride/carrier gas mixture, streams S1,S2 are discharged from the distribution conduit 46 and 60 through beds B1,B2 (sources), respectively, of reactivity-altering material to convert (reduce) the aluminum trichloride to more reactive aluminum subchloride gases, such as AlC12 and AlCl (a higher activity form of A1). In the context of forming exemplary CVD aluminide coatings on the nickel base superalloy substrates 45 having typical coating thicknesses in the range of approximately 1½ mils to 3 mils, the reactivity-altering material typically comprises a bed B1 of Al-Cr alloy particulates contained in each perforated, tubular canisters 70 disposed concentrically about the distribution conduit 46 as shown in FIG. 2 and a similar Al-Cr alloy particulates bed B2 supported on a screen 69 in each non-perforated canister 72 communicated to the interior of the substrates via the gas tubes 68 and to manifold 64 via gas openings 67 as also shown in FIG. 2. Each canister 70 includes inner and outer walls perforated as shown in FIG. 2 for flow of the stream S1 through the bed B1.

The subchloride gas stream thereby formed passes over the heated nickel base substrates 45 (substrate temperature 650° to 1200° C.) where the subchloride gas streams react with the substrate surfaces to form an oxidation and corrosion resistant aluminide coating thereon of a higher aluminum content and of a more "inward" diffusion type.

From FIG. 2, it is apparent that the distribution conduits 46,60 extend through both the exhaust region and the coating region of the reactor chamber. As a result, the gaseous reactant streams S1,S2 are heated as they travel through the conduits to the coating region Z1. Moreover, the streams S1,S2 are heated to greater extents as they travel farther into the coating region Z1 such that the temperature of the streams S1,S2 at the axially spaced coating zones A1,A2,A3 is different from one zone to the next. For example, the temperature of the stream S1 proximate the uppermost zone A1 has been measured to be about 820° C. whereas the temperature of the stream S1 has been measured to be about 900° C. proximate the lowermost zone A3 (temperature measurements made in the distribution conduit 46) when the substrates 45 are heated to a temperature of about 1010° C. A typical temperature profile of the stream S1 along the longitudinal axis of the distribution conduit 46 is as follows:

| zone A1 | 820° C. |
|---|---|
| zone A2 | 840° C. |
| zone A3 | 900° C. |

As is apparent, the stream temperature at zones A1 and A2 differs by only 20° C. whereas the stream temperature of zone A3 differs by 80° C. from that at zone A1 and by 60° C. from that at zone A2. A temperature difference between zones A1, A2, A3 of about 40°-50°

C. or more is considered substantial enough to require alteration of the composition of the beds B1 so as to provide substantially uniform stream reactivity at all zones A1, A2, A3.

The gaseous reactant stream S2 may exhibit a similar temperature profile along the longitudinal axis of conduit 60 for the same reasons, depending on the location of conduct 60 in relation to the furnace or retort.

In accordance with the present invention, the composition of the reactivity-altering material of beds B1,B2 differs between coating zones A1/A2 and A3 in dependence on the reactant stream temperatures at the coating zones A1/A2 versus zone A3 so as to alter the reactivity of the reactant stream in a manner to provide substantially the same reactant stream reactivity at all coating zones. Since the gaseous reactant stream comprises a volatile metal compound, the reactivity-altering means typically comprises an alloy of that metal wherein the concentration of the metal in the alloy varies between the coating zones A1/A2 and zone A3 of substantially different temperature. In particular, the concentration of the metal in the alloy varies inversely with the temperature of the volatile metal compound as necessary to accommodate substantial temperature variations thereof at the coating zones A1/A2 and A3.

With respect to the exemplary embodiment above, the concentration of aluminum in the Al-Cr alloy particulates varies between coating zones A1/A2 and zone A3 in inverse relation to the substantial reactant stream temperature differences at the coating zones A1/A2 and zone A3, thereby altering the reactivity of the stream (i.e., activity of aluminum in the stream) at the coating zones to accommodate the observed substantial temperature differences and provide substantially the same stream reactivity at all coating zones A1, A2, A3. One of the beds B1 may comprise unalloyed aluminum particulates while the other beds B1 may comprise the Al-Cr alloy particulates. In an exemplary embodiment for coating a RENE142 or IN738 substrate offered for purposes of illustration and not limitation, the aluminum content of the beds B1 varies with the temperature of stream S1 at the coating zones in the following manner:

| zone A1 | 60 wt. % Al/40 wt. % Cr |
| zone A2 | 60 wt. % Al/40 wt. % Cr |
| zone A3 | 44 wt. % Al/56 wt. % Cr |

In this embodiment, stream S1 comprised about 4 v/o AlCl$_3$/96 v/o H$_2$ (v/o=volume %) supplied at 132 liters/minute from generator 20. Each bed B1 contained the aforementioned Al-Cr alloy particulates having a particle size of $-\frac{1}{2}$ inch.$+\frac{3}{8}$ inch (i.e. particle size greater than $\frac{3}{8}$ inch and less than $\frac{1}{2}$ inch). Such Al-Cr alloy particulates are available from Reading Alloy, Reading, Pa.

The aluminum content of the beds B2 may also be varied in a similar manner as beds B1 as necessary to accommodate variations of the temperature of stream S2 at the coating zones A1, A2, A3. In the above embodiment, stream S2 comprised about 9 v/o AlCl$_3$/91-v/o H$_2$ supplied at 42 liters/minute from generator 22. Each bed B2 contained the aforementioned Al-Cr alloy particulates having a particle size of $-\frac{1}{2}$ inch $+\frac{3}{8}$ inch (i.e. particle size greater than $\frac{3}{8}$ inch and less than $\frac{1}{2}$ inch) available from Reading Alloy.

Variation of the aluminum concentration of the Al-Cr beds B1 and beds B2 in this manner in dependence on the reactant stream temperature at the coating zones A1,A2,A3 alters the reactivity of the reactant stream (i.e., activity of the aluminum or other chemical specie in the reactant stream) at the coating zones in a manner to provide substantially the same reactant stream reactivity at all coating zones regardless of substantial differences in stream temperature thereat. As a result, external and/or internal CVD coatings are produced and exhibit improved uniformity in composition and thickness from one coating zone to the next. For example, the thickness of aluminide coatings produced in accordance with the invention varies by only about 0.1 to about 0.2 mil from one coating zone to the next as compared to a variation in coating thickness of about 0.5 to about 0.6 mil when all of the beds B1 are 60 wt. % Al-40 wt. % Cr. Moreover, the uniformity of the coating composition and microstructure is improved in practicing the invention. The use of beds B2 allows independent control of the coating thickness and microstructure on the interior of hollow substrates. Aluminide coatings typically are formed to a nominal thickness in the range of about $1\frac{1}{2}$ to 3 mils, although the invention is not limited in this respect.

Although the reactivity-altering material has been illustrated above as comprising a source of Al-Cr alloy (e.g., Al-Cr particulates) when the streams S1,S2 comprise aluminum halide/carrier gas, the invention is not so limited and can be practiced using other reactivity-altering materials, such as Al-Co, Al-Fe, etc. Moreover, particulate mixtures of Al powder and another elemental and/or alloy powder may be used as the reactivity-altering material. Further, the particular reactivity-altering material used will depend on and be tailored to the composition of the particular reactant streams S1,S2 being used to effect deposition of a particular coating on the substrates. For example, in chromizing the substrates using chromium halide/carrier gas, the beds B1 and/or B2 could comprise Cr-Ni alloy having different compositions at different coating zones A1, A2, A3 in dependence on the temperature of the reactant stream at the zones.

Moreover, although the invention has been illustrated above using the gaseous reactant streams S1,S2 to independently coat the exterior and interior of the substrates 45, the invention is not so limited and may be practiced using only one of the streams S1,S2 as desired for a particular coating application.

As shown in FIG. 2, the lowermost portions 45a of the substrates 45 (root portions of the turbine blades) are contained or fixtured in a bed B3 of bonded inert filler particulates, such as alumina particulates bonded by an organic shellac type binder available from Alloy Surfaces, Wilmington, Del., contained in a masking canister 78 disposed on the canisters 72. The bed B3 of inert filler particulates functions to hold the substrate in position and to shield the lowermost substrate portions 45a from contact with and coating by the coating gas stream S1. As mentioned above, the substrates 45 are heated to a desired reaction temperature by radiation from the furnace-heated chamber wall 13a.

As a result of the coating reaction that occurs between the coating gas streams S1/S2 and the substrates 45, a spent gaseous stream SP (illustrated schematically in FIG. 2) is produced in the coating region Z1 and is removed from the reactor chamber 13 via the exhaust region Z2 thereof by action of the aforementioned pump 30. The spent reaction gaseous stream SP typically contains the carrier gas and also excess, unreacted reactant (e.g., metal halide gas) such as aluminum subchlorides in the exemplary embodiment described above.

Means 80 is disposed in the exhaust region Z2 for condensing excess, unreacted gaseous reactant from the spent gas stream SP before entry into the heated (180° C.) exhaust outlet conduit 83, which is disposed concentrically about the conduit 46 in the water-cooled reactor cover 26 and in communication with the pump 30 via conduit 85 as shown in FIG. 1.

The condensing means 80 includes an apertured, high surface area condensing structure 82 disposed in the exhaust region Z2 where the temperature of the spent gas stream SP is sufficiently reduced to condense the excess, unreacted gaseous reactant therefrom. A tubular enclosure 84 is disposed around the condensing structure 82 for directing the spent gas stream SP from the coating region Z1 to the condensing structure 82 where the excess, unreacted gaseous reactant can condense as a result of the lower temperature therein.

To this end, the condensing means 80 is located in the exhaust region or zone Z2 where the temperature of the spent gas stream SP will be sufficiently low to effect condensation of the excess, unreacted reactant on the structure 82. In effect, the condensing means 80 functions as a high surface area cold trap for condensing the excess, unreacted reactant from the spent gas stream SP.

For example, in coating nickel base superalloy substrates 45 using the aforementioned aluminum trichloride/carrier gas streams S1,S2 converted to subchlorides of aluminum, the gas temperature in the coating region Z1 typically varies from about 820° C. proximate the upper axial zone A1 to about 900° C. proximate the lower axial zone A3 as described above. In contrast, the temperature of the spent gas stream SP in the tubular enclosure 84 varies from about 385° C. proximate the water-cooled reactor cover 26 to about 850° C. proximate the collection member 92. The excess, unreacted aluminum subchlorides in the spent gas stream SP disproportionate and condense at about 660° C. on portions of the structure 82 at or below this temperature to form molten/solid Al crystals thereon. Plugging of the reactor exhaust outlet conduit 83 and other downstream exhaust components, such as conduit 85 and pump 30, is thereby avoided.

The apertured condensing structure 82 comprises a plurality of corrugated metal (e.g.,—Inconel 600) screens 88 stacked atop one another in the tubular enclosure 84. The screens 88 each comprise criss-crossed metal strips welded together where they intersect to form an aperture or perforated screen. The screens 88 each include a central opening for receiving the distribution conduit 46 extending centrally through the exhaust region Z2. The screens 88 are stacked such that the corrugations thereof are oriented perpendicularly to one another from one screen to the next in the stack.

The metal (e.g., Inconel 600) tubular enclosure 84 comprises an upper tubular member 90 enclosing the stacked screens 88 and having an open lower end 90a and a pan-shaped collection member 92 spaced beneath the tubular member 90 so as to provide a peripheral opening 96 therebetween through which the spent gas stream SP from the coating region Z1 is directed to pass through the screens 88. The collection member 92 functions to collect any condensed gaseous reactant falling or dripping from the screens 88 so as to avoid damage to the underlying coated substrates 45.

For example, when the excess, unreacted reactant comprises aluminum subchlorides ($AlCl_2/AlCl$), the condensate on the screens 88 comprises aluminum in the molten and/or solid crystal forms. The aluminum condensate can fall or drip downwardly from the screens 88 toward the coating region Z1 during a coating cycle. However, the collection member 92 catches and collects the aluminum condensate and prevents contact and resultant damage to the coated substrates 45 therebelow. The collection member 92 also functions as a thermal barrier between the coating region and the exhaust region.

The tubular member 90 and the collection member 92 include respective peripheral side walls 90b,92b closely proximate an outer side wall 13a of the reactor chamber 13 (e.g., a space of ⅛ inch therebetween) to facilitate direction of the spent gas stream SP from the coating region Z1 into the peripheral opening 96 therebetween.

The enclosure 84 and the screens 88 can be removable periodically from the exhaust region during shutdown of the reactor 10 (after the reactor cover 26 is removed) for cleaning of the enclosure and the screens to remove the excess, unreacted reactant condensed thereon. For example, when the condensate comprises aluminum, the condensate is removed by an acid (e.g., nitric acid) stripping operation. The stripped or cleaned enclosure 84 and the screens 88 can then be returned to the exhaust region Z2 for reuse.

The means 80 described above for removing excess, unreacted reactant from the spent gas stream SP is described in commonly assigned and copending application Ser. No. 07/803,340 entitled "CVD Apparatus And Method", the teachings of which are incorporated herein by reference.

While the invention has been described in terms of specific embodiments thereof, it is not intended to be limited thereto but rather only to the extent set forth hereafter in the claims which follow.

We claim:

1. In a method of chemical vapor deposition of a coating on a plurality of substrates disposed at multiple zones in a heated coating chamber of a reactor, the steps comprising:
    (a) supplying a gaseous reactant stream to the chamber for distribution to each zone in a manner that the stream is heated to substantially different temperatures at different zones,
    (b) heating the substrates,
    (c) contacting the gaseous reactant stream at said different zones having substantially different reactant stream temperatures thereat with a reactivity-altering material whose composition is different between said different zones in dependence on the stream temperature at said different zones as necessary to alter the reactivity of the reactant stream at said different zones in a manner to provide substantially the same stream reactivity at said different zones, and
    (d) contacting at least one of said substrates at each of said different zones with the gaseous reactant stream after said stream contacts the reactivity-altering material at said different zones.

2. The method of claim 1 wherein in step d), an external surface of the substrate is contacted by said stream at the zones.

3. The method of claim 1 wherein in step d), an internal surface of the substrate is contacted by said stream at the zones.

4. The method of claim 1 wherein in step d), internal and external surfaces of the substrate are contacted by said stream at the zones.

5. The method of claim 1 including supplying a volatile metal compound to the zones in step a).

6. The method of claim 5 including in step c), contacting the volatile metal compound with particulates of an alloy of the metal at the zones.

7. The method of claim 6 including varying the concentration of the metal in the alloy inversely with the substantial temperature differences of the compound between zones.

8. In a method of chemical vapor deposition of an aluminide coating on a plurality of substrates disposed at multiple zones in a heated coating chamber of a reactor, the steps comprising:
   a) supplying an aluminum halide gas stream to the chamber for distribution to each zone in a manner that the stream is heated to substantially different temperatures at different zones,
   b) heating the substrates,
   c) contacting the aluminum halide gas stream at said different zones having substantially different reactant stream temperatures thereat with a source of aluminum whose concentration of aluminum varies between said different zones in inverse relation to the stream temperature at said different zones as necessary to alter the reactivity of the metal halide gas stream at said different zones in a manner to provide substantially the same stream reactivity at said different zones, and
   d) contacting at least one of said substrates at each of said different zones with the metal halide gas stream after said stream contacts the said source of aluminum at said different zones.

9. The method of claim 8 wherein the step d), an external surface of the substrate is contacted by said stream at the zones.

10. The method of claim 8 wherein in step d), an internal surface of the substrate is contacted by said stream at the zones.

11. The method of claim 8 wherein in step d), internal and external surfaces of the substrate are contacted by said stream at the zones.

12. The method of claim 8 including in step c), contacting the aluminum halide gas stream with particulates of the aluminum alloy at the zones.

13. The method of claim 8 including in step c), contacting the aluminum halide gas stream with particulates of an aluminum-chromium alloy at the zones.

* * * * *

UNITED STATES PATENT AND TRADEMARK OFFICE
CERTIFICATE OF CORRECTION

PATENT NO. : 5 264 245

DATED : November 23, 1993

INVENTOR(S) : David C. PUNOLA, et al

It is certified that error appears in the above-identified patent and that said Letters Patent is hereby corrected as shown below:

On the title page, item [75] Inventors: replace "Jeffrey"
    with ---Jeffery---.

Column 12, line 12; replace "wherein the" with
    ---wherein in---.

Signed and Sealed this

Seventh Day of June, 1994

*Attest:*

BRUCE LEHMAN

*Attesting Officer*  *Commissioner of Patents and Trademarks*